United States Patent [19]

Akioka et al.

[11] Patent Number: 4,948,994

[45] Date of Patent: Aug. 14, 1990

[54] SEMICONDUCTOR CIRCUIT FOR DRIVING THE BASE OF A BIPOLAR TRANSISTOR

[75] Inventors: Takashi Akioka, Hitachi; Atsuo Watanabe, Hitachiota; Takahiro Nagano, Hitachi, all of Japan

[73] Assignee: Hitachi, Ltd., Tokyo, Japan

[21] Appl. No.: 254,568

[22] Filed: Oct. 7, 1988

[30] Foreign Application Priority Data

Oct. 9, 1987 [JP] Japan .................. 62-253700

[51] Int. Cl.$^5$ ............... H03K 17/60; H03K 17/687; H03K 3/01; H03K 19/02
[52] U.S. Cl. .................... 307/570; 307/574; 307/579; 307/585; 307/270; 307/451; 307/446; 307/315; 307/254
[58] Field of Search ............ 307/570, 571, 576, 579, 307/585, 451, 253, 254, 270, 446, 315, 300, 280, 574, 581

[56] References Cited

U.S. PATENT DOCUMENTS

| 3,443,122 | 5/1969 | Bowers, Jr. ............... | 307/570 |
| 3,521,081 | 7/1970 | Vasseur et al. ............ | 307/446 |
| 3,603,821 | 9/1971 | Flachsbarth ............... | 307/253 |
| 3,940,681 | 2/1976 | Ohsawa .................... | 307/253 |
| 4,024,418 | 5/1977 | Hankel ..................... | 307/451 |
| 4,590,395 | 5/1986 | O'Connor et al. .......... | 307/570 |
| 4,816,705 | 3/1989 | Ohba et al. ............... | 307/446 |

FOREIGN PATENT DOCUMENTS

| 0134731 | 3/1985 | European Pat. Off. . |
| 0209805 | 1/1987 | European Pat. Off. . |
| 2002925 | 2/1968 | France . |
| 0137730 | 10/1981 | Japan . |
| 59-19435 | 1/1984 | Japan . |
| 59-25424 | 2/1984 | Japan . |
| 60-16022 | 1/1985 | Japan . |
| 60-51326 | 3/1985 | Japan . |
| 61-53828 | 3/1986 | Japan . |
| 61-93655 | 5/1986 | Japan . |
| 61-289723 | 12/1986 | Japan . |

OTHER PUBLICATIONS

IBM Technical Disclosure Bulletin, vol. 20, No. 9, Feb. 1978, pp. 3466–3467.
IEEE Journal of Solid-State Circuits, vol. SC-7, No. 5, Oct. 1972, pp. 411–417.

Primary Examiner—Stanley D. Miller
Assistant Examiner—Trong Quang Phan
Attorney, Agent, or Firm—Antonelli, Terry, Stout & Kraus

[57] ABSTRACT

A system providing a drive circuit for a bipolar transistor high in speed and low in power consumption even under a low source voltage using a MOSFET is disclosed. The base current of the bipolar transistor is supplied not by short-circuiting the collector and the base thereof by a MOSFET but from another base current source.

22 Claims, 9 Drawing Sheets

FIG. 8 ical circuits
that include a bipolar transistor and a MOSFET that
can be fabricated on the same substrate.

SEMICONDUCTOR CIRCUIT FOR DRIVING THE BASE OF A BIPOLAR TRANSISTOR

BACKGROUND OF THE INVENTION

The present invention relates to a bipolar transistor circuit in general, or more in particular to a drive circuit for a bipolar transistor suitable for integrated circuits that include a bipolar transistor and a MOSFET that can be fabricated on the same substrate.

Conventional drive systems for bipolar transistors using a field effect transistor (MOSFET) in integrated circuits are classified into the types shown in FIG. 1A to FIG. 1E relating to an NPN bipolar transistor (hereinafter sometimes referred to as NPN or NPN transistor). FIGS. 2A to 2E show a similar classification relating to a PNP bipolar transistor (hereinafter sometimes referred to as a PNP or PNP transistor). In addition to these systems, there may be more complicated systems with combined series and parallel connections. In these classifications, those methods which are different only in the method of drawing the base current are considered to belong to the same category.

In Figs. 1A to 1E and 2A to 2E, reference numerals 200 to 206 designate signal input terminals, numerals 207 to 211 bipolar transistors which driven are, numerals 212 to 218 MOSFETs for driving them and numerals 100 and 101, negative and positive power supply terminals, respectively.

The feature of the combined circuits shown in Figs. 1A to 1D and FIGS. 2A to 2D lies in that a bipolar transistor is turned on by short-circuiting the collector and base thereof by means of a MOSFET, and turned off by opening the collector-base circuit thereof.

Figure 1A:
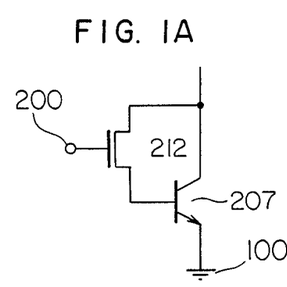
Figs. 1A to 1E are diagrams showing circuits for driving a bipolar transistor by a MOSFET.
Figure 1B:
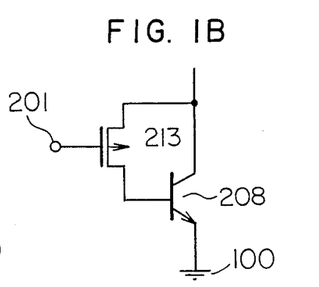
Figures 1C, 1D:
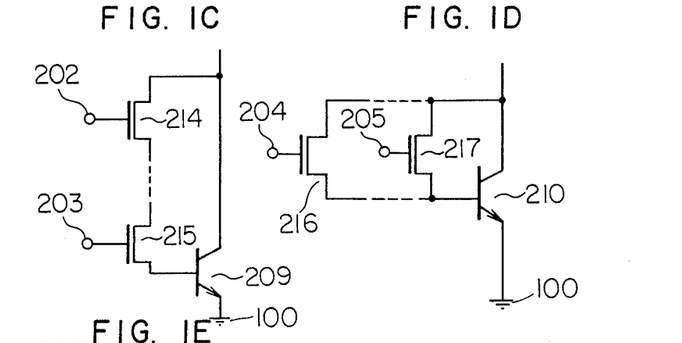
Figure 1E:
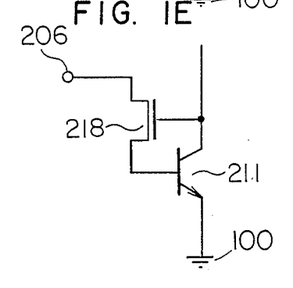
Figure 2A:
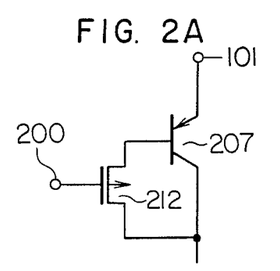
FIGS. 2A to 2E are diagrams showing other circuits similar to those shown in FIG. 1.
Figure 2B:
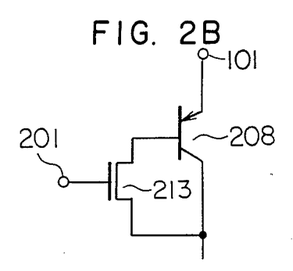
Figures 2C, 2D:
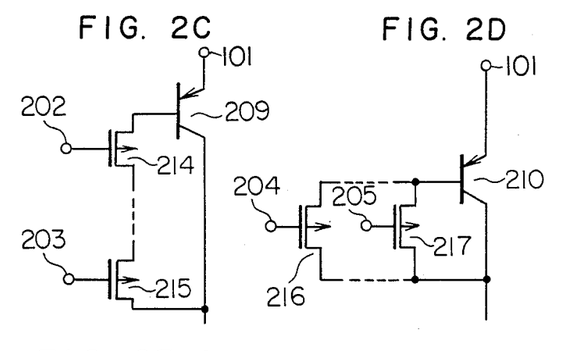
Figure 2E:
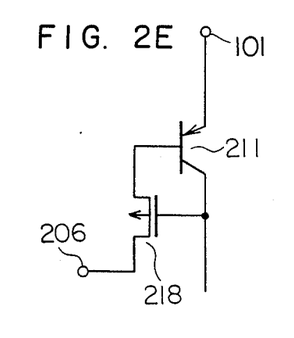

The systems shown in Figs. 1E and 2E, on the other hand, in which the gate of a MOSFET is connected to the collector of a bipolar transistor, is not applicable to a circuit having a plurality of input terminals. The present invention will therefore be explained below in comparison with the drive systems of the former type.

Systems of this type are disclosed, for example, in JP-A-No. 61-53828, U.S. Pat. No. 354135, JP-A-No. 59-19435, JP-A-No. 60-16022, JP-A-No. 60-51326, JP-A-No. 59-25424, JP-A-No. 61-93655 and JP-A-No. 61-289723.

Explanation will now be made about a problem posed by the prior art, that is, a method in which the collector and base of a bipolar transistor are short-circuited by a MOSFET.

Generally, if the switching speed of a bipolar transistor is to be increased, it is necessary to supply an increased amount of base current. In the conventional system of driving a bipolar transistor by a MOSFET, however, if a sufficiently large capacity of current supply of a MOSFET, that is, the conductance of a MOSFET turned on, is not obtained for some reasons or other, the switching rate of the bipolar transistor is determined undesirably by the capacity of the MOSFET, and the intended performance is not achieved. With the reduction in the gate length, for instance, the withstanding voltage of the MOSFET is decreased, and therefore if a fine MOSFET of high performance is to be used, it may be necessary to reduce the voltage impressed on the MOSFET. In such a case, however, a smaller voltage applied to the gate of the MOSFET would reduce the conductance of the MOSFET in its on state, thereby making it impossible to attain a high performance which otherwise could be attained with reduction in size.

SUMMARY OF THE INVENTION

The object of the present invention is to provide a drive circuit for a bipolar transistor comprising a MOSFET which operates at high speed and with a low power consumption even with a low source voltage.

In order to achieve this object, according to the present invention, there is provided a bipolar transistor drive circuit in which the base current of a bipolar transistor is supplied not by short-circuiting the collector and the base thereof by a MOSFET but from other base current source.

A basic configuration of such a circuit is shown in FIG. 3. In FIG. 3A, numeral 1 designates a signal input terminal, numeral 2 a bipolar transistor to be driven, numeral 3 a depletion-type MOSFET for driving the bipolar transistor, and numeral 4 a capacitor.

More specifically, an input terminal is connected to the drain of a depletion-type MOSFET through a capacitor, so that the base current is capable of being supplied through the capacitor and the MOSFET in a transient stage where the potential of the input terminal is undergoing a change.

Figure 4:
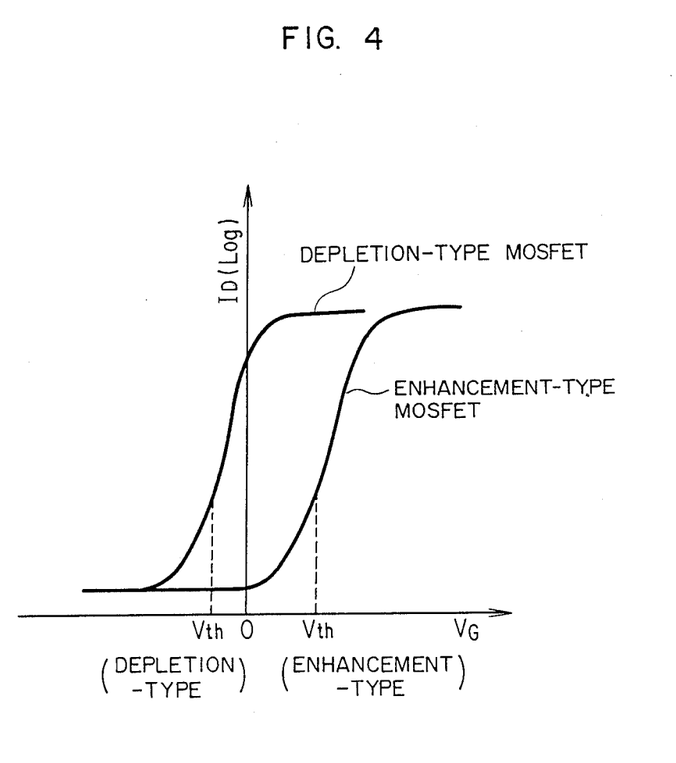
FIG. 4 is a diagram showing a voltage-current characteristic indicating the difference between an enhancement-type MOSFET and a depletion-type MOSFET.

Instead of using an enhancement-type MOSFET which has so far been used to overcome the problems of the conventional systems, a depletion-type MOSFET may be incorporated in that place in a conventional system. A depletion-type MOSFET, as compared with an enhancement-type MOSFET, as shown in a schematic diagram of FIG. 4, has a smaller apparent threshold voltage $V_{th}$, and therefore, under the same gate voltage, can produce a larger current than an enhancement-type MOSFET. In the depletion-type MOSFET, however, a leak current flows even at a gate voltage $V_G$ of 0 V, and therefore if the collector and base of a bipolar transistor are connected through such a MOSFET as in the prior art, a leak current also would flow from collector to base also when the MOSFET is turned off to turn off the bipolar transistor. In other words, if the collector potential of a bipolar transistor (NPN type) is to be maintained at high level by turning it off, the base current would undesirably increase at the same time.

The problem of leak current that otherwise would flow from the collector to base through a depletion-type MOSFET with a bipolar transistor turned off is automatically solved in a circuit according to the present invention in which the collector of a bipolar transistor is no longer connected to the base thereof.

For supplying a base current in a transient state, power is obtained from an input terminal through a capacitor, thereby eliminating the leak current from the input terminal under steady state (with the input terminal potential undergoing not any change). Further, since the base current flows from the input terminal through the capacitor in a transient state, the switching speed is not reduced.

DESCRIPTION OF THE PREFERRED EMBODIMENTS

Embodiments of the present invention will be explained below.

FIGS. 3A to 3F show basic circuits according to embodiments of the present invention.

Reference numerals 1, 5, 9, 10, 16, 17, 23, 24, 30 and 31 designate signal input terminals, numerals 2, 6, 11, 18, 25 and 32 bipolar transistors to be driven, numerals 3, 7, 12, 13, 19, 20, 26, 27, 33 and 34 MOSFETs for driving the bipolar transistors, and numerals 4, 8, 14, 15, 21, 22, 28, 29, 35 and 36 capacitors.

(Embodiment 1)

Figure 3A:
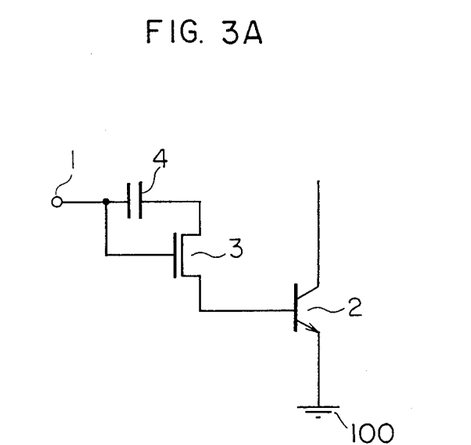
FIGS. 3A to 3F show circuits according to the first and the second embodiments of the present invention respectively.

FIG. 3A shows a circuit for driving an NPN bipolar transistor 2 by a signal supplied from an input terminal 1 through an nMOSFET (n-channel MOSFET) 3 and the capacitor 4. With the change in input level from "low" to "high" level, the nMOSFET 3 is turned on and the base current is supplied from the input terminal through the capacitor 4.

Figure 3B:
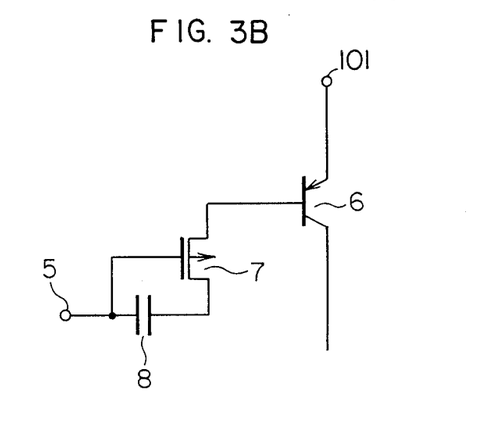

FIG. 3B shows a circuit for driving a PNP bipolar transistor 6 by a current supplied from the input terminal 5 through a pMOSFET (p-channel MOSFET) 7 and the capacitor 8. With the change in input signal level from "high" to "low", the pMOSFET 7 is turned on, thereby drawing the base current to the input terminal through the capacitor 8.

(Embodiment 2)

FIGS. 3C, 3D, 3E and 3F show examples configured for logical operation to meet the requirements of a multi-input logical circuit using the principle of a basic circuit explained with reference to the first embodiment.

Figure 3C:
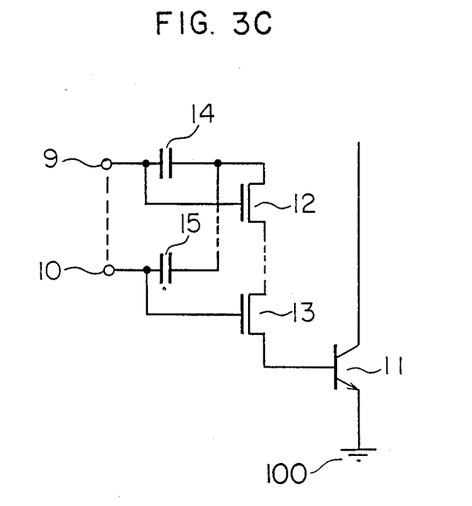

In FIG. 3C, numeral 9 designates an input terminal, numeral 14 a first capacitor, and numeral 12 a first nMOSFET. Numeral 10 designates an N-th input terminal, numeral 15 an N-th capacitor, and numeral 13 an N-th nMOSFET. A number N of these devices are connected in series so that only when the input of all the N devices become "high", the base current is supplied to the NPN bipolar transistor 11 thereby to cause an operation as an AND circuit.

Figure 3D:
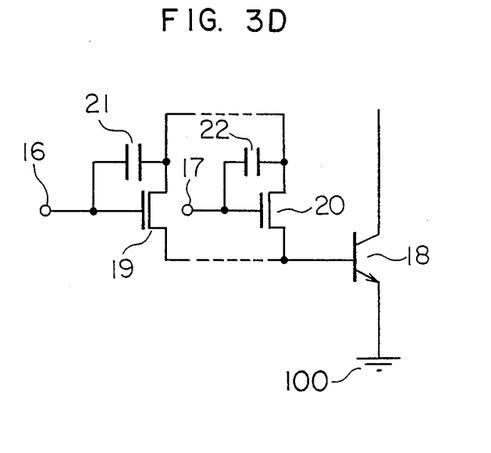

Similarly, in FIG. 3D, numeral 16 designates an input terminal, numeral 21 a first capacitor, and numeral 19 a first nMOSFET. Numeral 17 designates an N-th input terminal, numeral 22 an N-th capacitor, and numeral 20 an N-th nMOSFET. A number N of these devices are connected in parallel as shown, so that when at least one of the N inputs becomes "high", the base current is supplied to the 18 NPN bipolar transistors thereby to perform an operation as an OR gate.

Figure 3E:
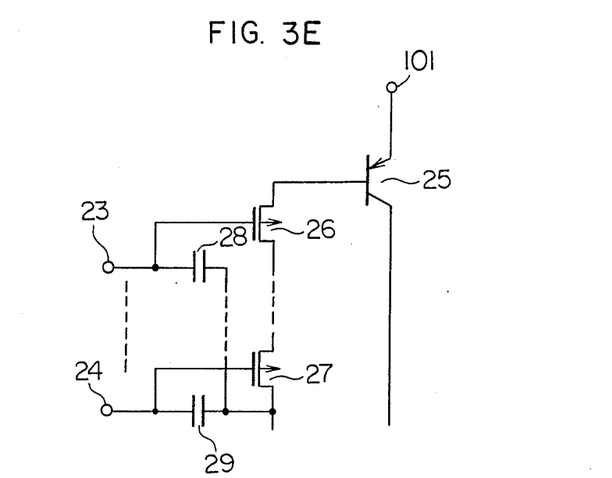
Figure 3F:
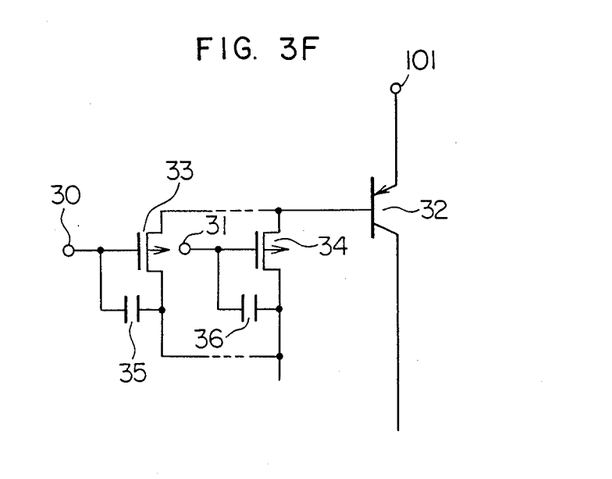

FIGS. 3E and 3F are diagrams showing a method of performing a logical operation as in FIGS. 3C and 3D with a PNP transistor.

In FIG. 3, numeral 23 designates a first input terminal, numeral 28 a first capacitor, and numeral 26 a first pMOSFET. Numeral 24 designates an N-th input terminal, numeral 29 an N-th capacitor, and numeral 27 an N-th pMOSFET. A number N of these devices are connected in series as shown so that only when all the N inputs become "high", the base current is supplied to the PNP bipolar transistor 25 to perform an operation as an AND gate.

In similar fashion, in FIG. 3F, numeral 30 designates the first terminal, numeral 35 a first capacitor, and numeral 33 a first pMOSFET. Also, numeral 31 designates an N-th input terminal, numeral 36 an N-th capacitor, and numeral 34 an N-th pMOSFET. A number N of these devices are connected in parallel to each other as shown so that when at least one of the N inputs becomes "high", the base current is supplied to all the 32 PNP bipolar transistors thereby to perform an operation as an OR gate.

According to this embodiment which is applicable to various logical circuits, a drive circuit for a bipolar transistor high in speed and low in power consumption is produced using a MOSFET.

(Embodiment 3)

Figure 5:
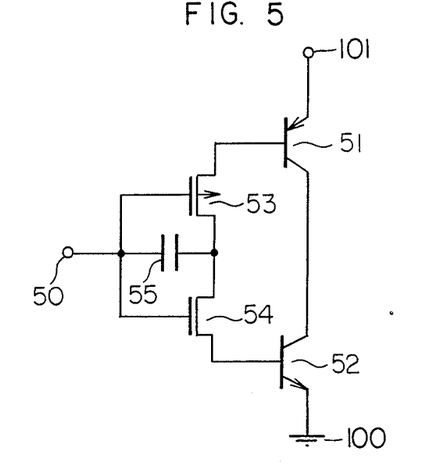
FIG. 5 is a diagram showing a circuit according to the third embodiment of the present invention.

FIG. 5 is a diagram showing a basic configuration of the present invention as applied to a complementary bipolar transistor using both a PNP transistor and as NPN transistor.

Numeral 50 designates a signal input terminal, numerals 51 and 52 a PNP transistor and an NPN transistor to be driven respectively, numeral 53 a pMOSFET (p-channel MOSFET), numeral 54 an nMOSFET (n-channel MOSFET) and numeral 55 a capacitor.

In FIG. 5, the collectors of the PNP transistor 51 and the NPN transistor 52 are connected to each other, the base of the PNP transistor 51 is connected with the source of pMOSFET 53, the base of the NPN transistor 52 with the source of the nMOSFET 54, and the drains of the pMOSFET 53 and the nMOSFET 54 are connected to each other. The drains of the pMOSFET 53 and nMOSFET 54 are also connected through a capacitor 55 to the input terminal 50 on the one hand and to the gates of the pMOSFET 53 and nMOSFET 54 on the other.

As in the case of Embodiment 1, when the input terminal changes from "high" to "low" level, the base current of the transistor 51 is drawn out, while when the input terminal 50 changes from "low" to "high" level, the base current is supplied to the transistor 52, thus performing a complementary operation of bipolar transistors in which only one of the bipolar transistors 51 and 52 is turned on or off by an input signal applied to the terminal 50.

According to this embodiment, no current leaks to the collector from the input terminal under steady state of operation, and therefore it is possible to realize a high-speed logical circuit with low power consumption by the complementary operation of bipolar transistors.

(Embodiment 4)

Figure 6:
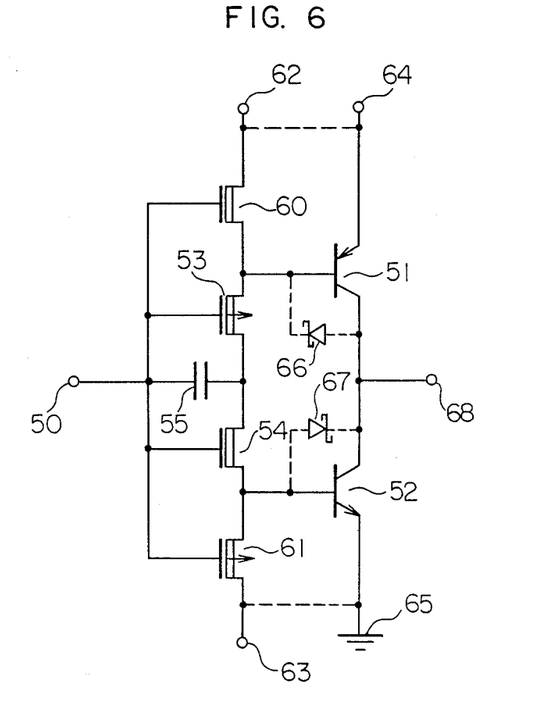
FIG. 6 is a diagram showing a circuit according to the fourth embodiment of the present invention.

FIG. 6 shows an embodiment of an inverter logical gate circuit using a basic configuration of embodiment 3.

In FIG. 6, numeral 50 designates an input terminal, numeral 51 a PNP transistor, numeral 52 an NPN transistor, numeral 53 an pMOSFET, numeral 54 a nMOSFET and numeral 55 a capacitor. All of these devices are configured in a manner similar to FIG. 5. All the MOSFETs included in this circuit configuration are of depletion type. Numeral 60 designates an nMOSFET, numeral 61 a pMOSFET, and numeral 62 a power terminal of the MOSFETs. The power terminal 62 of the MOSFETs is usually set at the same polarity as the power terminal 64 of the bipolar transistors. As shown by dashed line, the power terminal 62 may be connected with the power terminal 64 of the bipolar transistors. Numeral 65 designates a reference potential terminal of the bipolar transistors, and numeral 63 a reference potential terminal of the MOSFETs. These terminals 63 and 65 may also be connected in the manner shown. Numerals 66 and 67 designate diodes such as Schottky barrier diodes for clamping the PNP transistor 51 and the NPN transistor 52 respectively, which may be connected in the manner shown by dashed lines in the drawing.

Now, the operation of this circuit will be explained.

First, when the signal input terminal 50 is at "low" level, the pMOSFET 53 and pMOSFET 61 are turned on, a current the magnitude of which depends on the leak current of the nMOSFET 54 flows through the base-emitter junction of the PNP transistor 51, pMOSFET 53, nMOSFET 54 and pMOSFET 61, so that the output terminal 58 becomes "high".

When the signal input terminal 50 is at "high" level, on the other hand, the nMOSFET 54 and the nMOSFET 60 are turned on, and a current the magnitude of which depends on the leak current of the pMOSFET 53 flows through the base-emitter junction of the PNP transistor 52, nMOSFET 54, pMOSFET 53 and nMOSFET 60, so that the NPN transistor 52 is turned on, thereby reducing the output terminal 68 to "low" level.

Now, explanation will be made about the operation effected when the signal input terminal 50 shifts from "low" to "high" level. With the potential at 50 beginning to rise, the nMOSFET 54 is turned on, the base current is supplied to the NPN transistor 52 through the capacitor 55 and the nMOSFET 54 thereby to turn on the transistor 52.

With the shifting of the signal input terminal 50 from "high" to "low" level, on the other hand, the pMOSFET 53 is turned on, and the base current of the PNP transistor 51 is drawn to the terminal 50 through the capacitor 55 and the pMOSFET 53, thereby to turn on the transistor 51.

The reason why pMOSFET 53 and nMOSFET 54 are of depletion type is that as will be seen from the foregoing explanation, a small amount of leak current is supplied to determine a base potential in DC fashion even in a turned-off state on the one hand and a large base current is secured by a smaller turn-on resistance in a transient state thereby to attain a higher switching speed on the other.

According to the present embodiment, the following advantages are obtained:
(1) Since only the holding current for the DC potential of bipolar transistors flows under steady state, the power consumption of logical circuits is reduced.
(2) Under a transient state, the base current is supplied to bipolar transistors through a capacitor, and therefore a high switching speed is attained.

Further, the use of this circuit permits the speed of a logical gate equivalent to the prior art circuits with a prior art source voltage even when the value of the source voltage drops by 66%.

(Embodiment 5)

Figure 7:
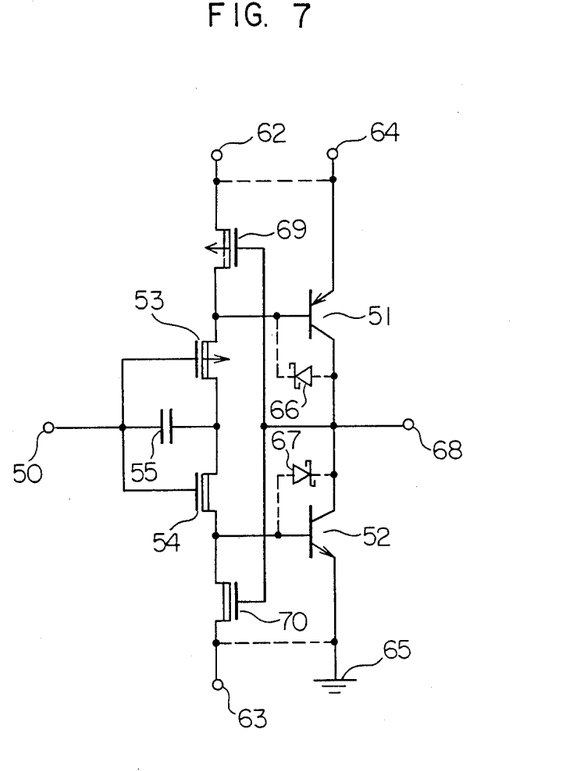
FIG. 7 is a diagram showing a circuit according to the fifth embodiment of the present invention.

FIG. 7 shows still another embodiment of the inverter logical gate circuit.

In FIG. 7, numerals 50 to 55 and 62 to 68 designate the same component parts designated by the same numerals as in Embodiment 4. This embodiment is different from Embodiment 4 in a MOSFET used as a means for drawing the base current of the bipolar transistors 51 and 52. In Embodiment 4, a gate signal is introduced from an input terminal thereof, while in this embodiment, a similar signal is drawn from the output terminal 68. For this purpose, a pMOSFET 69 and an nMOSFET 70 are inserted.

This embodiment 5 attains the same effect as Embodiment 4.

(Embodiment 6)

Figure 8:
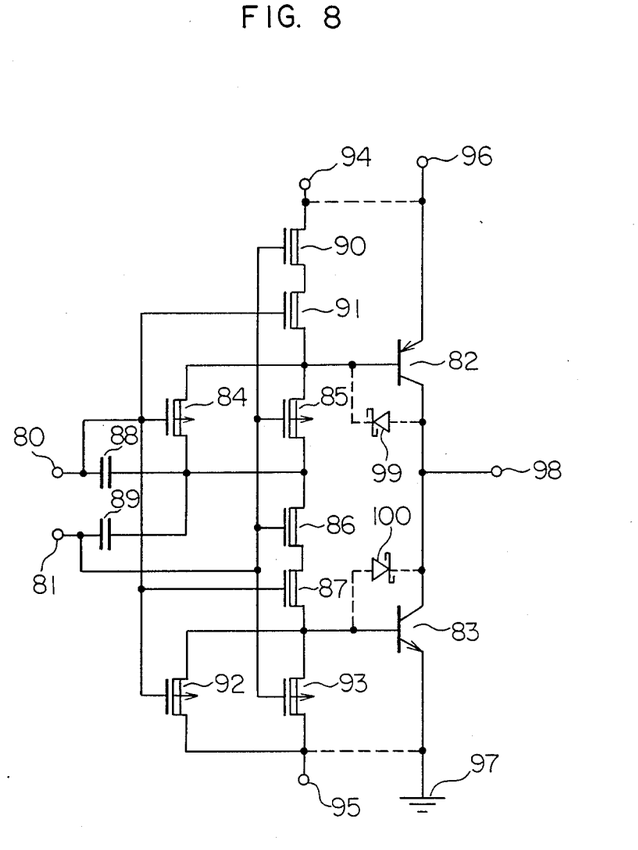
FIG. 8 is a diagram showing a circuit according to the sixth embodiment of the present invention.

FIG. 8 shows a 2-input NAND logical circuit according to embodiment of the device according to the present invention.

In FIG. 8, numerals 80, 81 designate an input terminal, numeral 98 an output terminal, numerals 84, 85 a pMOSFET, numerals 86, 87 an nMOSFET, and numerals 88, 89 a capacitor.

The input terminal 80 is connected to the gate of the pMOSFET 84, the gate of nMOSFET 91, the gate of the nMOSFET 87 and the gate of the pMOSFET 92, on the one hand, and to the source of the pMOSFET 84, the drain of the pMOSFET 85, the drain of the nMOSFET 86 and the capacitor 89 through the capacitor 88 at the same time.

The input terminal 81 is connected to the capacitor 89 on the one hand, and to the gate of the nMOSFET 90, the gate of the pMOSFET 85, the gate of the nMOSFET 86 and the gate of the pMOSFET 93 on the other.

The collectors of the PNP transistor 82 and the NPN transistor 83 are connected to each other, and to the output terminal 98 at the same time. These transistors may be clamped by the diodes 99 and 100 respectively.

The emitter of the PNP transistor 82 is connected to the power terminal 92 of the bipolar transistors or, as shown by dashed line, may be connected to the power terminal 94 of the MOSFETs.

The emitter of the NPN transistor 83 is connected to the reference potential terminal 97 of the bipolar transistors, and at the same time, to the reference potential terminal 95 of the MOSFETs as shown by dashed line in the drawing.

The drain of the nMOSFET 90 is connected to the power terminal 94 of the MOSFETs, and the source thereof to the drain of the nMOSFET 91.

The source of the nMOSFET 91 is connected to the base of the PNP transistor 82, the drain of the pMOSFET 85 and the drain of the pMOSFET 84.

The source of the pMOSFET 85 is connected to the drain of the nMOSFET 86.

The source of the nMOSFET 86 is connected to the drain of the nMOSFET 87.

The source of the nMOSFET 87 is connected to the base of the NPN transistor 83, the source of the pMOSFET 93 and the source of the pMOSFET 92.

The drain of the pMOSFET 93 is connected to the drain of pMOSFET 92 and the reference potential terminal 95 of the MOSFETs.

In the aforementioned connections of the MOSFETs, the sources may be replaced by the drains. In this configuration, when at least one of the two input terminals is reduced to "low" level, the base current of the PNP transistor 82 is drawn to the input terminals. When both the input terminals become "high", on the other hand, the base current is supplied from the input terminals to the NPN transistor 83.

Numerals 90, 91 designate nMOSFET, and numerals 92, 93 a pMOSFET for turning on and off the bipolar transistors 82, 83 according to the potential level of the input terminals 80 and 81 for operation as a NAND gate. Table shows the operating conditions according to the levels of the input terminals 80 and 81. Even in the case of "OFF" indicated in Table 1, however, a leak current flows in view of the fact that the MOSFETs 84 to 93 are of depletion type.

| Input terminal | | pMOS | pMOS | nMOS | nMOS | nMOS | nMOS | pMOS | pMOS | PNP | NPN | Output terminal |
|---|---|---|---|---|---|---|---|---|---|---|---|---|
| 80 | 81 | 84 | 85 | 86 | 87 | 90 | 91 | 92 | 93 | 82 | 83 | 98 |
| High | High | OFF | OFF | ON | ON | ON | ON | OFF | OFF | OFF | ON | Low |
| High | Low | OFF | ON | OFF | ON | OFF | ON | OFF | ON | ON | OFF | High |
| Low | High | ON | OFF | ON | OFF | ON | OFF | ON | OFF | ON | OFF | High |
| Low | Low | ON | ON | OFF | OFF | OFF | OFF | ON | ON | ON | OFF | High |

The embodiment realizes a 2-input NAND logical gate circuit which is capable of operating at high speed and with low power consumption even at a low source voltage of about 3 V.

In place of a 2-input NAND circuit explained in the embodiment above, the present invention may also be applied with equal effect to a NAND circuit with three or more or more inputs or a NOR circuit with two or more inputs of similar configuration.

It will thus be understood from the foregoing description that according to the present invention, there is provided a drive circuit for a bipolar transistor by use of a MOS of depletion type, which operates at high speed with low power consumption at a low source voltage as compared with the conventional drive circuits for bipolar transistors.

We claim:

1. A semiconductor circuit system comprising an NPN bipolar transistor, a capacitor and an nMOS FET, wherein the base of the NPN bipolar transistor is connected with the source of the nMOS FET, the gate of the nMOS FET is used as an input terminal, a capacitor is inserted between the input terminal and the drain of the nMOS FET, and the NPN bipolar transistor is driven by the signal applied to the input terminal, and wherein an ON-OFF operation of the NPN bipolar transistor for a current flowing through a collector-emitter path of the NPN bipolar transistor to a negative terminal of a power supply coupled to the NPN bipolar transistor is controlled by a voltage applied to the input terminal.

2. A semiconductor circuit system according to claim 1, wherein the nMOS FET is of depletion type.

3. A semiconductor circuit system comprising a PNP transistor and an NPN transistor with the collectors thereof connected to each other, wherein the base of the PNP transistor is connected to the source of a pMOS-FET, the base of the NPN transistor is connected to the source of an nMOSFET, the drains of the pMOSFET and the nMOSFET are connected to each other and also through a capacitor to the input terminal, and the gates of the pMOSFET and the nMOSFET are connected to said input terminal.

4. A semiconductor circuit system according to claim 3, wherein at least one of the PNP transistor and the NPN transistor is clamped by a diode.

5. A semiconductor circuit system according to claim 4, wherein the diode is a Schottky barrier diode.

6. A semiconductor circuit system comprising a PNP biopolar transistor, a capacitor and a pMOS FET, wherein the base of the PNP bipolar transistor is connected with the source of the pMOS FET, the gate of the pMOS FET is used as an input terminal, a capacitor is inserted between the input terminal and the drain of the pMOS FET, and the PNP bipolar transistor is driven by the signal applied to the input terminal, and wherein an ON-OFF operation of the PNP bipolar transistor for a current flowing through a collector-emitter path of the PNP bipolar transistor from a positive terminal of a power supply coupled to the PNP bipolar transistor is controlled by a voltage applied to the input terminal.

7. A semiconductor circuit system according to claim 6, wherein the pMOS FET is of depletion type.

8. A semiconductor circuit comprising:
a first power supply terminal;
a second power supply terminal;
a PNP bipolar transistor and an NPN bipolar transistor coupled to have collector-emitter paths thereof in series between the first and second power supply terminals with an emitter of the PNP bipolar transistor coupled to the first power supply terminal, an emitter of the NPN bipolar transistor coupled to the second power supply terminal, and collectors of said PNP and NPN bipolar transistors coupled to one another;
an output terminal coupled to the collectors of said PNP and NPN bipolar transistors;
a third power supply terminal;
a fourth power supply terminal;
a first nMOSFET, a second pMOSFET, a third nMOSFET and a fourth pMOSFET coupled to have source-drain paths thereof respectively in series between the third and fourth power supply terminals, wherein a connecting node between said first nMOSFET and said second pMOSFET is coupled to a base of said PNP bipolar transistor, and wherein a connecting node between said third nMOSFET and said fourth pMOSFET is coupled to a base of said NPN bipolar transistor;
an input terminal coupled in common to gates of each of said first nMOSFET, said second pMOSFET, said third nMOSFET and said fourth pMOSFET; and
a capacitor coupled between said input terminal and a connecting node between said second pMOSFET and said third nMOSFET.

9. A semiconductor circuit according to claim 8, further comprising a first clamping diode coupled between the base and the collector of said PNP bipolar transistor and a second clamping diode coupled between the base and the collector of said NPN bipolar transistor.

10. A semiconductor circuit according to claim 8, wherein said first power supply terminal is coupled to said third power supply terminal and wherein said second power supply terminal is coupled to said fourth power supply terminal.

11. A semiconductor circuit according to claim 8, wherein said first power supply terminal is coupled to a positive power supply source and wherein said second power supply terminal is coupled to ground.

12. A semiconductor circuit according to claim 10, wherein said first and third power supply terminals are coupled to a positive power supply source and wherein said second and fourth power supply terminals are coupled to ground.

13. A semiconductor circuit comprising:
a first power supply terminal;
a second power supply terminal;
a PNP bipolar transistor and an NPN bipolar transistor coupled to have collector-emitter paths thereof in series between the first and second power supply terminals with an emitter of the PNP bipolar transistor coupled to the first power supply terminal, an emitter of the NPN bipolar transistor coupled to the second power supply terminal, and collectors of said PNP and NPN bipolar transistors coupled to one another;
an output terminal coupled to the collectors of said PNP and NPN bipolar transistors;
a third power supply terminal;
a fourth power supply terminal;
a first pMOSFET, a second pMOSFET, a third nMOSFET and a fourth nMOSFET coupled to have source-drain paths thereof respectively in series between the third and fourth power supply terminals, wherein a connecting node between said first pMOSFET and said second pMOSFET is coupled to a base of said PNP bipolar transistor, and wherein a connecting node between said third nMOSFET and said fourth nMOSFET is coupled to a base of said NPN bipolar transistor;
an input terminal coupled in common to gates of said second nMOSFET and said third nMOSFET; and
a capacitor coupled between said input terminal and a connecting node between said second pMOSFET and said third nMOSFET,
wherein gates of said first pMOSFET and said fourth nMOSFET are coupled in common to said output terminal.

14. A semiconductor circuit according to claim 13, further comprising a first clamping diode coupled between the base and the collector of said PNP bipolar transistor and a second clamping diode coupled between the base and the collector of said NPN bipolar transistor.

15. A semiconductor circuit according to claim 13, wherein said first power supply terminal is coupled to said third power supply terminal and wherein said second power supply terminal is coupled to said fourth power supply terminal.

16. A semiconductor circuit according to claim 13, wherein said first power supply terminal is coupled to a positive power supply source and wherein said second power supply terminal is coupled to ground.

17. A semiconductor circuit according to claim 15, wherein said first and third power supply terminals are coupled to a positive power supply source and wherein said second and fourth power supply terminals are coupled to ground.

18. A semiconductor circuit comprising:
a first power supply terminal;
a second power supply terminal;
a PNP bipolar transistor and an NPN bipolar transistor coupled to have collector-emitter paths thereof in series between the first and second power supply terminals with an emitter of the PNP bipolar transistor coupled to the first power supply terminal, an emitter of the NPN bipolar transistor coupled to the second power supply terminal, and collectors of said PNP and NPN bipolar transistors coupled to one another;
an output terminal coupled to the collectors of said PNP and NPN bipolar transistors;
a third power supply terminal;
a fourth power supply terminal;
a first nMOSFET, a second nMOSFET, a third pMOSFET, a fourth nMOSFET, a fifth nMOSFET and a sixth pMOSFET coupled to have source-drain paths thereof respectively in series between the third and fourth power supply terminals, wherein a connecting node between said second nMOSFET and said third pMOSFET is coupled to a base of said PNP bipolar transistor, and wherein a connecting node between said fifth nMOSFET and said sixth pMOSFET is coupled to a base of said NPN bipolar transistor;
a seventh pMOSFET coupled to have a source-drain path thereof in parallel with the source-drain path of said third pMOSFET;
an eighth pMOSFET coupled to have a source-drain path thereof in parallel with the source-drain path of said sixth pMOSFET;
a first input terminal coupled to gates to said second nMOSFET, said third pMOSFET, said fourth nMOSFET and said sixth pMOSFET;
a first capacitor coupled between said first input terminal and a connecting node of said seventh pMOSFET, said third pMOSFET and said fourth nMOSFET; and
a second capacitor coupled between said second input terminal and said connecting node of said seventh pMOSFET, said third pMOSFET and said fourth nMOSFET.

19. A semiconductor circuit according to claim 18, further comprising a first clamping diode coupled between the base and the collector of said PNP bipolar transistor and a second clamping diode coupled between the base and the collector of said NPN bipolar transistor.

20. A semiconductor circuit according to claim 18, wherein said first power supply terminal is coupled to said third power supply terminal and wherein said second power supply terminal is coupled to said fourth power supply terminal.

21. A semiconductor circuit according to claim 18, wherein said first power supply terminal is coupled to a positive power supply source and wherein said second power supply terminal is coupled to ground.

22. A semiconductor circuit according to claim 20, wherein said first and third power supply terminals are coupled to a positive power supply source and wherein said second and fourth power supply terminals are coupled to ground.

* * * * *